(12) United States Patent
Lee et al.

(10) Patent No.: US 7,790,523 B2
(45) Date of Patent: Sep. 7, 2010

(54) MASK FOR FORMING A THIN-FILM TRANSISTOR, THIN-FILM TRANSISTOR SUBSTRATE MANUFACTURED USING THE SAME AND METHOD OF MANUFACTURING A THIN-FILM TRANSISTOR SUBSTRATE USING THE SAME

(75) Inventors: Young-Wook Lee, Suwon-si (KR); Woo-Geun Lee, Yongin-si (KR); Jung-In Park, Suwon-si (KR); Youn-Hee Cha, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 61 days.

(21) Appl. No.: 11/861,113

(22) Filed: Sep. 25, 2007

(65) Prior Publication Data
US 2008/0073718 A1    Mar. 27, 2008

(30) Foreign Application Priority Data
Sep. 27, 2006    (KR)    ............... 10-2006-0094197

(51) Int. Cl.
*H01L 21/00*    (2006.01)
*H01L 21/84*    (2006.01)
(52) U.S. Cl. .................. 438/151; 430/5; 257/E21.7
(58) Field of Classification Search .............. 430/5; 257/347, E21.7, E27.112; 438/151
See application file for complete search history.

(56) References Cited

U.S. PATENT DOCUMENTS 6,995,047 B2 *    2/2006    Hwang .................. 438/149

FOREIGN PATENT DOCUMENTS

| CN | 1164673 A | 11/1997 |
| CN | 1702530 A | 11/2005 |
| JP | 2005-072135 | 3/2005 |
| KR | 1020020057229 | 7/2002 |

* cited by examiner

*Primary Examiner*—W. David Coleman
*Assistant Examiner*—Sonya D McCall-Shepard
(74) *Attorney, Agent, or Firm*—Innovation Counsel LLP

(57) ABSTRACT

A mask that is capable of forming a thin-film transistor (TFT) with improved electrical characteristics is presented. The mask includes a drain mask pattern, a source mask pattern and a light-adjusting pattern. The drain mask pattern blocks light for forming a drain electrode. The source mask pattern blocks light for forming a source electrode and faces the drain mask pattern. A distance between the drain and source mask patterns is no more than the resolution of an exposing device. The light-adjusting pattern is formed between end portions of the source mask pattern and the drain mask pattern to block at least some light from entering a space between the source and drain mask patterns.

15 Claims, 11 Drawing Sheets

FIRST DIRECTION

SECOND DIRECTION

MASK FOR FORMING A THIN-FILM TRANSISTOR, THIN-FILM TRANSISTOR SUBSTRATE MANUFACTURED USING THE SAME AND METHOD OF MANUFACTURING A THIN-FILM TRANSISTOR SUBSTRATE USING THE SAME

CROSS-REFERENCE TO RELATED APPLICATIONS

The present application claims priority under 35 U.S.C. §119 to Korean Patent Application No. 2006-94197 filed on Sep. 27, 2006 in the Korean Intellectual Property Office (KIPO), the contents of which are herein incorporated by reference in their entirety.

BACKGROUND OF THE INVENTION

1. Field of the Invention

The present invention relates to a thin-film transistor (TFT) substrate and a method of manufacturing a TFT substrate using a mask. More particularly, the present invention relates to a mask for forming a TFT, a TFT substrate manufactured using the mask and a method of manufacturing the TFT substrate using the mask.

2. Description of the Related Art

A liquid crystal display (LCD) device, in general, displays an image using light transmittance of liquid crystal. The LCD device includes an LCD panel and a backlight assembly. The LCD panel displays images using light. The backlight assembly supplies the LCD panel with light.

The LCD panel includes an array substrate, a color filter substrate and a liquid crystal layer. The array substrate includes a thin-film transistor (TFT) and a pixel electrode. The color filter substrate includes a color filter and a common electrode. The liquid crystal layer is interposed between the array substrate and the color filter substrate.

The TFT includes a gate electrode, a semiconductor pattern, a source electrode and a drain electrode. The semiconductor pattern is formed on the gate electrode. The source electrode is formed on the semiconductor pattern. The drain electrode is formed on the semiconductor pattern, and is spaced apart from the source electrode. In addition, a channel formed in the semiconductor pattern has a short length so that electrons are easily transported between the source electrode and the drain electrode.

The array substrate is formed using a plurality of masks. In general, the array substrate is formed using four masks. Recently, a method for manufacturing the array substrate using fewer masks has been developed. For example, the number of masks for forming the semiconductor pattern, the source electrode and the drain electrode has been decreased.

However, when the number of the masks is decreased, the length of the channel is restricted and manufacturing costs are increased.

SUMMARY OF THE INVENTION

The present invention provides a mask for forming a thin-film transistor (TFT).

The present invention also provides a TFT substrate manufactured using the above-mentioned mask.

The present invention also provides a method of manufacturing the above-mentioned TFT substrate.

A mask for forming a TFT in accordance with one aspect of the present invention includes a drain mask pattern, a source mask pattern and a light-adjusting pattern. The drain mask pattern blocks light for forming a drain electrode. The source mask pattern blocks light for forming a source electrode and faces the drain mask pattern while being separated from the drain mask pattern by a distance that is no more than the resolution of an exposing device. The light-adjusting pattern is formed between each end portion of the source mask pattern and the drain mask pattern to block at least some light from entering a space between the source and drain mask patterns from the exterior.

A mask for forming a TFT in accordance with another aspect of the present invention includes a drain mask pattern, a source mask pattern, a light-adjusting pattern and a translucent layer. The drain mask pattern blocks light for forming a drain electrode. The source mask pattern blocks light for forming a source electrode, and faces the drain mask pattern. The light-adjusting pattern is formed between each end portion of the source mask pattern and the drain mask pattern to block at least some light from entering a space between the source and drain mask patterns. The translucent layer covers a space between the drain and source mask patterns to partially transmit light.

A TFT substrate in accordance with still another aspect of the present invention includes a base substrate, a gate line, a gate insulating layer, an active pattern, a data line and a drain electrode. The gate line is formed on the base substrate and electrically connected to the gate electrode. The gate insulating layer is formed on the base substrate to cover the gate line and the gate electrode. The active pattern is formed on the gate insulating layer corresponding to the gate electrode. The data line extends in a direction different from the gate line and is electrically connected to a source electrode that overlaps the active pattern. Two sides of the source electrode define an imaginary line, and a side of the active pattern overlaps or extends beyond the imaginary line. The drain electrode faces the source electrode and overlaps the active pattern. The active pattern has substantially the same outline as the data line and the drain electrode except for a space between the source and drain electrodes.

A method of manufacturing a TFT substrate in accordance with yet another aspect of the present invention is provided. The method entails forming a gate insulating layer, an active layer, a data metal layer and a photoresist film are formed on a base substrate having a gate electrode to cover the gate electrode. The photoresist film is exposed using a mask, which includes a drain mask pattern, a source mask pattern spaced apart from the drain mask pattern and facing the drain mask pattern, and a light-adjusting pattern interposed between two end portions of the source mask pattern and the drain mask pattern to form a photoresist pattern having a channel groove between the drain and source mask patterns. The data metal layer and the active layer are partially etched using the photoresist pattern as an etching mask to form a data metal pattern and an active pattern. A thickness of the photoresist pattern is decreased so that the data metal pattern is exposed through the channel groove. The data metal pattern is partially etched through the channel groove to form a data line having a source electrode and a drain electrode.

According to the present invention, the mask has a single slit so that the length of the channel may be decreased. Also, the light-adjusting pattern may block at least some light from entering a region between the source mask pattern and the drain mask pattern to decrease the width of the channel. Thus, electrical characteristics of the TFT may be improved.

BRIEF DESCRIPTION OF THE DRAWINGS

The above and other advantages of the present invention will become more apparent by describing in detail example embodiments thereof with reference to the accompanying drawings, in which.

DESCRIPTION OF THE EMBODIMENTS

Figure 1:
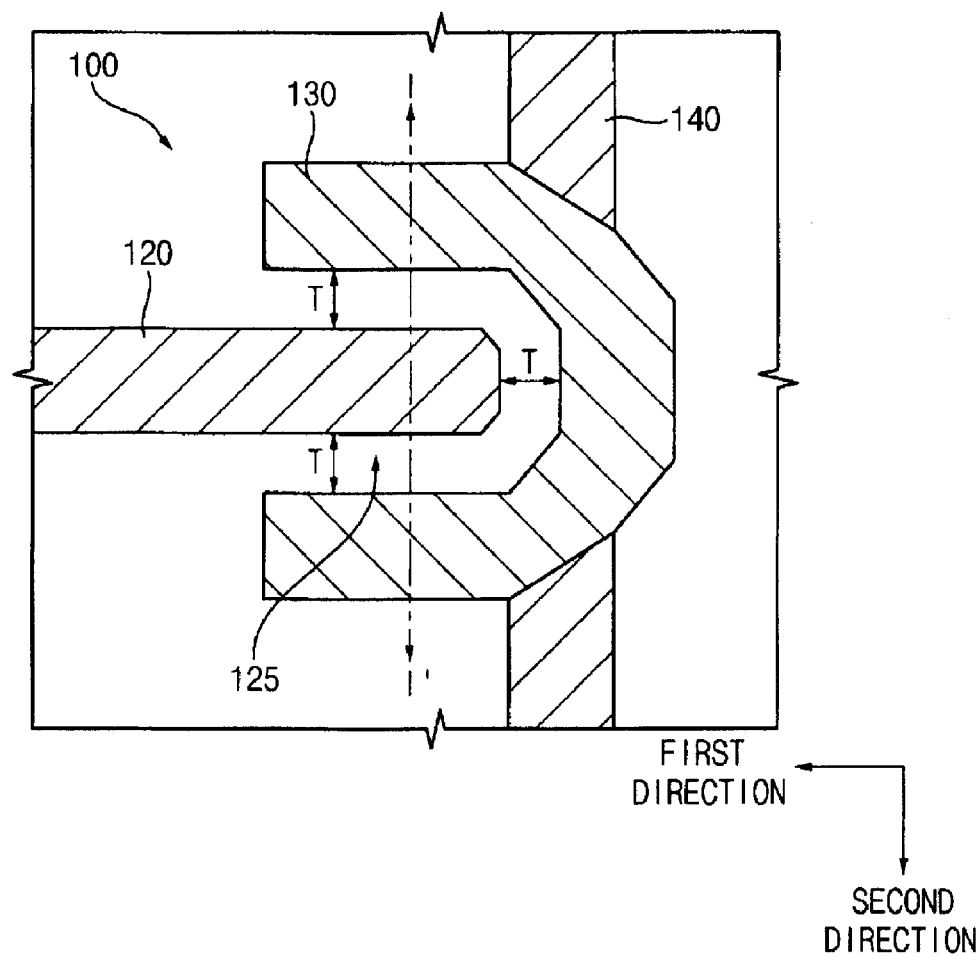
FIG. 1 is a plan view illustrating a mask for forming a thin-film transistor (TFT) in accordance with a first example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
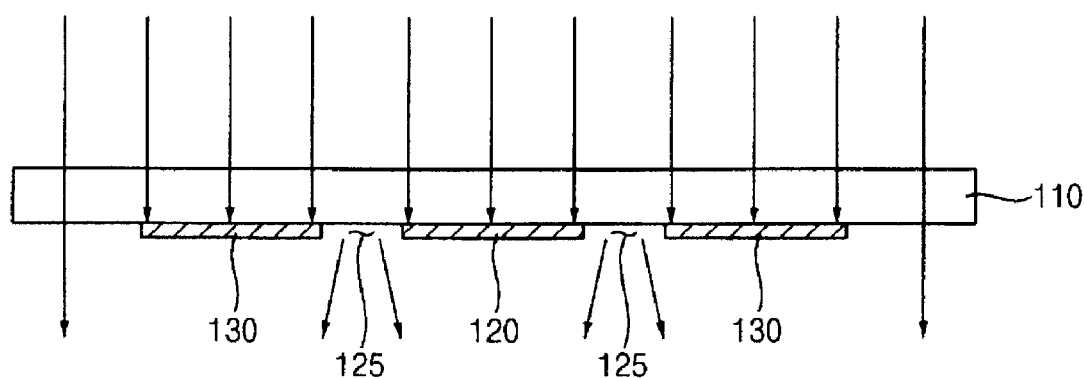
FIG. 2 is a cross-sectional view taken along a line I-I' shown in FIG. 1.

FIG. 1 is a plan view illustrating a mask for forming a thin-film transistor (TFT) in accordance with a first example embodiment of the present invention. FIG. 2 is a cross-sectional view taken along a line I-I' shown in FIG. 1.

Referring to FIGS. 1 and 2, a mask 100 includes a transparent substrate 110, a drain mask pattern 120, a source mask pattern 130 and a data mask pattern 140. The mask 100 is used for forming a TFT.

The transparent substrate 110 has a plate shape. Examples of a transparent material that can be used for the transparent substrate 110 include glass, quartz, a synthetic resin, etc.

The drain mask pattern 120 is formed on a surface of the transparent substrate 110. In FIGS. 1 and 2, the drain mask pattern 120 extends in a first direction. The drain mask pattern 120 includes a light-blocking material such as chromium (Cr). The drain mask pattern 120 corresponds to a drain electrode of the TFT.

The source mask pattern 130 is spaced apart from the drain mask pattern 120, and is disposed on the surface of the transparent substrate 110. The source mask pattern 130 includes a light-blocking material such as chromium (Cr). The source mask pattern 130 corresponds to a source electrode of the TFT. In FIGS. 1 and 2, the source mask pattern 130 has a U-shape surrounding a portion of the drain mask pattern 120.

When the source mask pattern 130 having the U-shape surrounding the portion of the drain mask pattern 120 is spaced apart from the drain mask pattern 120 to form a slit 125 interposed between the drain mask pattern 120 and the source mask pattern 130. The slit 125 has a U-shape. For example, a width T of the slit 125 may be no more than a resolution of an exposing device. The width T of the slit 125 is a distance between the drain mask pattern 120 and the source mask pattern 130. For example, the resolution of the exposing device may be about 3.5 μm, and the width T of the slit 125 may be about 2 μm to about 3 μm. In FIGS. 1 and 2, the width T of the slit 125 may be about 2.5 μm. The resolution of the exposing device is a minimum size of a mask pattern patterned using the exposing device.

The data mask pattern 140 is formed on the surface of the transparent substrate 110 and extends from the source mask pattern 130 in a second direction that is substantially perpendicular to the first direction. The data mask pattern 140 includes a light-blocking material such as chromium (Cr). The data mask pattern 140 corresponds to a data line electrically connected to the source electrode.

According to the mask 100 of FIGS. 1 and 2, the width T of the slit 125 formed between the drain mask pattern 120 and the source mask pattern 130 is no more than the resolution of the exposing device, so that light incident on the mask 100 is diffracted in the slit 125 of the mask. Thus, an exposure amount of the light under the slit 125 may be decreased.

Alternatively, a slit mask pattern (not shown) having double slits may be formed between the drain mask pattern 120 and the source mask pattern 130. However, when the slit mask pattern has the double slits, the length of the channel formed on the active pattern of the TFT is increased. For example, a width of a central slit mask pattern may be about 1 μm, and a distance between the central slit mask pattern and the drain mask pattern 120 may be about 1 μm. Also, a distance between the central slit mask pattern and the source mask pattern 130 may be about 1 μm. Thus, a total length of the channel having the double slits may be no less than at least about 3.5 μm when allowing for a margin for diffraction of the light.

However, in FIGS. 1 and 2, the mask 100 having a single slit is used to form the TFT, so that the channel is shorter than the mask having two slits. Thus, the electrical characteristics of the TFT may be improved. For example, the length of the channel may be no more than about 3.5 μm. The length of the channel is the distance between the source electrode and the drain electrode of the TFT.

Figure 3:
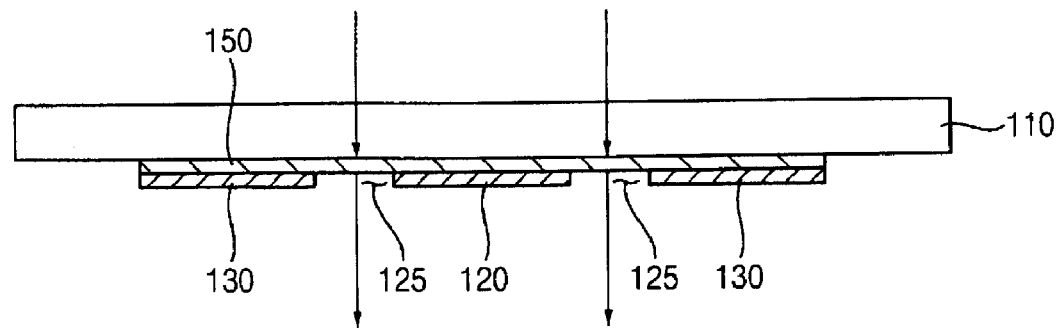
FIG. 3 is a cross-sectional view illustrating a mask for forming a TFT in accordance with another example embodiment of the present invention.

FIG. 3 is a cross-sectional view illustrating a mask for forming a TFT in accordance with another embodiment of the present invention.

Referring to FIG. 3, the mask further comprises a translucent layer 150 to decrease the amount of light passing through the mask.

The translucent layer 150 is formed on a surface of a transparent substrate 110 to cover the space between a drain mask pattern 120 and a source mask pattern 130. For example, the translucent layer 150 may be interposed between the transparent substrate 110 and the drain and source mask patterns 120 and 130. Alternatively, the translucent layer 150 may be formed on the transparent substrate 110 to cover the drain and source mask patterns 120 and 130. The translucent layer 150 may also be formed on another surface of the transparent substrate 110.

The translucent layer 150 transmits a portion of the light incident on a slit 125 of the mask, thereby decreasing the amount of the light passing through the slit 125.

According to the mask shown in FIG. 3, the amount of the light passing through the mask may be easily controlled by the slit 125 and the translucent layer 150.

Figure 4:
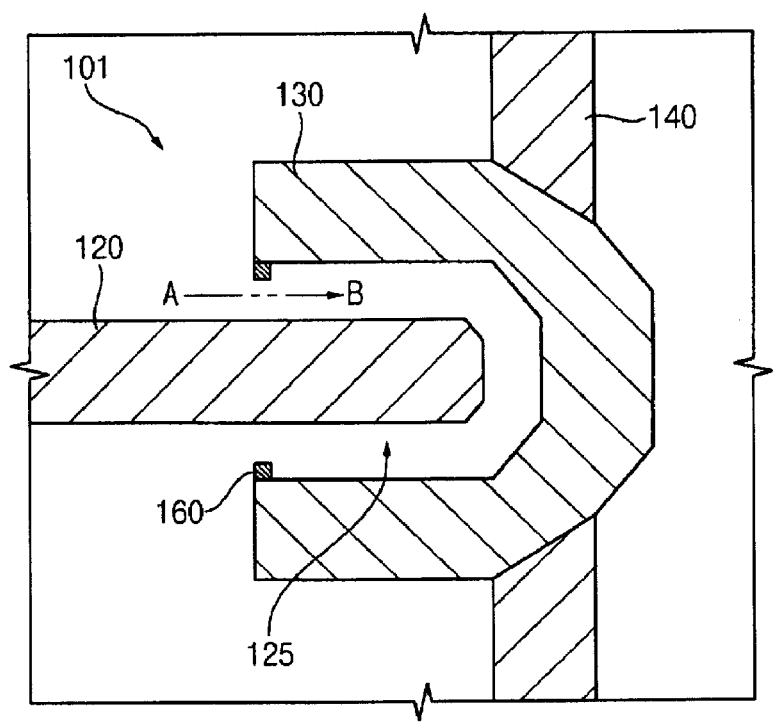
FIG. 4 is a plan view illustrating a mask for forming a TFT in accordance with a second example embodiment of the present invention.

FIG. 4 is a plan view illustrating a mask for forming a TFT in accordance with a second embodiment of the present invention.

Referring to FIGS. 2 and 4, a mask 101 includes the transparent substrate 110, the drain mask pattern 120, the source mask pattern 130, the data mask pattern 140 and a light-adjusting pattern 160.

The transparent substrate 110, the drain mask pattern 120, the source mask pattern 130 and the data mask pattern 140 of FIG. 4 are substantially the same as in FIGS. 1 and 2. Thus, the same reference numerals will be used to refer to the same or like parts as those described in FIGS. 1 and 2, and any redundant explanation concerning the above elements will be omitted.

The light-adjusting pattern 160 is interposed between each of two end portions of the source mask pattern 130 and the drain mask pattern 120 to block the light that is incident on a space between the source mask pattern 130 and the drain mask pattern 120.

For example, the light-adjusting pattern 160 may be formed on a surface of the transparent substrate 110, and is connected to each of the end portions of the source mask pattern 130. In FIG. 4, the light-adjusting pattern 160 protrudes from each of the end portions of the source mask pattern 130.

The size of the light-adjusting pattern 160 is no more than a resolution of an exposing device. For example, the width of the light-adjusting pattern 160 may be about 3 μm to about 2 μm. Preferably, the width of the light-adjusting pattern 160 is about 1 μm to about 1.5 μm.

In FIG. 4, the light-adjusting pattern 160 has a substantially rectangular shape. Alternatively, the light-adjusting pattern 160 may have an elliptical shape, a polygonal shape, etc.

According to the mask 101 of FIG. 4, the light-adjusting pattern 160 is disposed between the end portions of the source mask pattern 130 and the drain mask pattern 120 to block the light incident on the slit 125.

When the mask 101 does not include the light-adjusting pattern 160, a portion of light irradiated onto a portion "A" of the mask 101 may be incident on a portion "B" of FIG. 4. When the portion of the light irradiated onto the portion "A" is incident on the portion "B," the effective width of the channel may be decreased, deteriorating the electrical characteristics of the TFT.

In FIG. 4, the light-adjusting pattern 160 is disposed between each of the end portions of the source mask pattern 130 and the drain mask pattern 120 to prevent the light that shines onto the portion "A" from being incident on the portion "B". This way, the width of the channel is increased.

Figure 5:
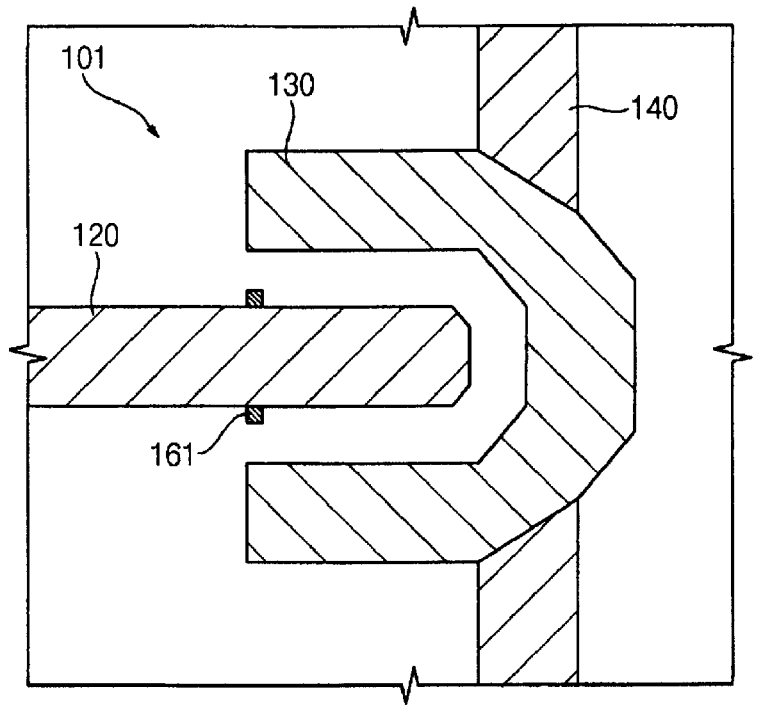
FIG. 5 is a plan view illustrating a mask for forming a TFT in accordance with still another example embodiment of the present invention.

FIG. 5 is a plan view illustrating a mask for forming a TFT in accordance with still another embodiment of the present invention.

Referring to FIG. 5, a light-adjusting pattern 161 may be connected to a drain mask pattern 120.

For example, the light-adjusting pattern 161 may be interposed between each of the two end portions of a source mask pattern 130 and the drain mask pattern 120, and protrude from the drain mask pattern 120 toward the source mask pattern 130.

Figure 6:
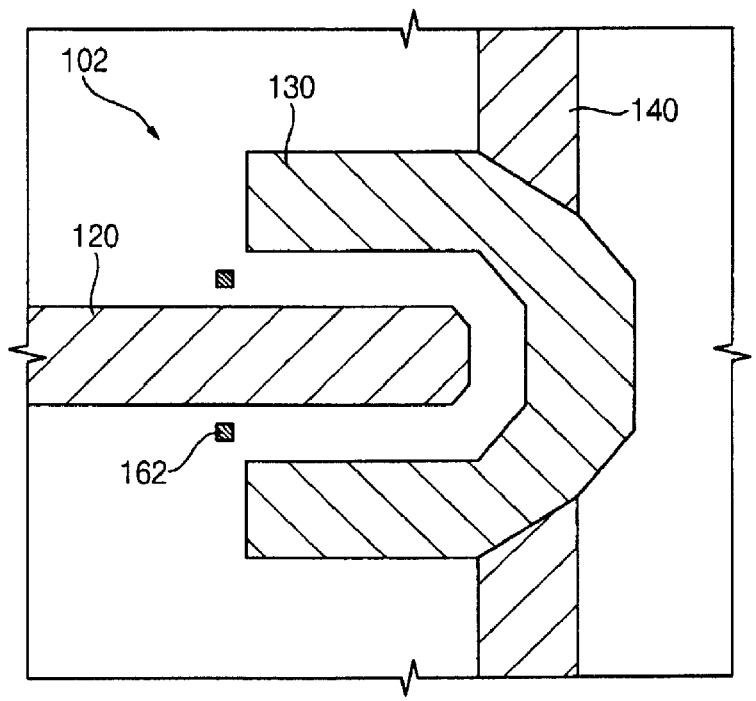
FIG. 6 is a plan view illustrating a mask for forming a TFT in accordance with a third example embodiment of the present invention.

FIG. 6 is a plan view illustrating a mask for forming a TFT in accordance with a third embodiment of the present invention.

Referring to FIGS. 2 and 6, a mask 102 includes the transparent substrate 110, the drain mask pattern 120, the source mask pattern 130, the data mask pattern 140 and a light-adjusting pattern 162.

The transparent substrate 110, the drain mask pattern 120, the source mask pattern 130 and the data mask pattern 140 of FIG. 6 are substantially the same as in FIGS. 1 and 2. Thus, the same reference numerals will be used to refer to the same or like parts as those described in FIGS. 1 and 2, and any redundant explanation concerning the above elements will be omitted.

The light-adjusting pattern 162 is formed on a surface of the transparent substrate 110, and is interposed between each of the two end portions of the source mask pattern 130 and the drain mask pattern 120. The size of the light-adjusting pattern 162 is no more than a resolution of an exposing device. For example, the width of the light-adjusting pattern 162 may be about 1 µm to about 2 µm. Preferably, the width of the light-adjusting pattern 162 may be about 1 µm to about 1.5 µm.

For example, the light-adjusting pattern 162 may be spaced apart from each of the drain and source mask patterns 120 and 130 by a distance of about 1 µm to about 2 µm. In FIG. 6, the light-adjusting pattern 162 is spaced apart from each of the drain and source mask patterns 120 and 130 by a distance of about 1 µm to about 1.5 µm.

According to the mask 102 of FIG. 6, the light-adjusting pattern 162 is interposed between each of the end portions of the source mask pattern 130 and the drain mask pattern 120 to block the light incident on a space between the source and drain mask patterns 130 and 120 from the exterior.

Figure 7:
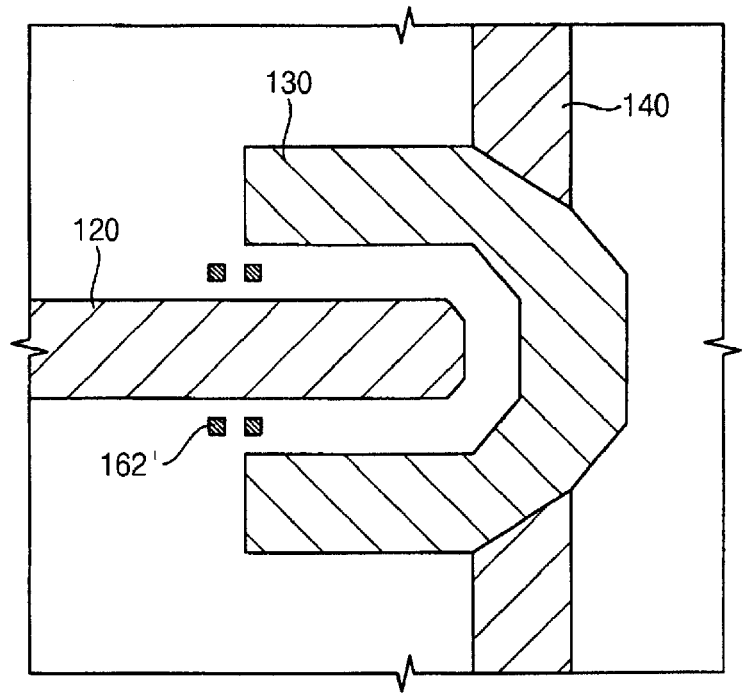
FIG. 7 is a plan view illustrating a mask for forming a TFT in accordance with further still another example embodiment of the present invention.

FIG. 7 is a plan view illustrating a mask for forming a TFT in accordance with still another embodiment of the present invention.

Referring to FIG. 7, a plurality of light-adjusting patterns 162' is interposed between each of two end portions of a source mask pattern 130 and a drain mask pattern 120. Adjacent light-adjusting patterns 162' are spaced apart from each other by a distance of no less than about 1 µm.

In FIG. 7, the light-adjusting patterns 162' are aligned along an imaginary central line that extends through the half-way-points between the source mask pattern and the drain mask pattern 120. Alternatively, the light-adjusting patterns 162' may be arranged in various shapes.

Figure 8:
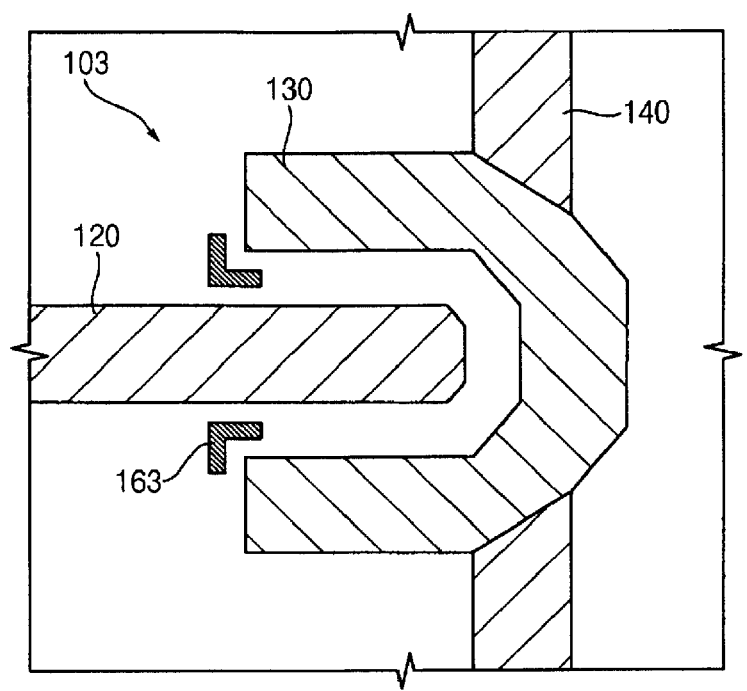
FIG. 8 is a plan view illustrating a mask for forming a TFT in accordance with a fourth example embodiment of the present invention.

FIG. 8 is a plan view illustrating a mask for forming a TFT in accordance with a fourth embodiment of the present invention.

Referring to FIGS. 2 and 8, a mask 103 includes the transparent substrate 110, the drain mask pattern 120, the source mask pattern 130, the data mask pattern 140 and a light-adjusting pattern 163.

The transparent substrate 110, the drain mask pattern 120, the source mask pattern 130 and the data mask pattern 140 of FIG. 8 are substantially the same as in FIGS. 1 and 2. Thus, the same reference numerals will be used to refer to the same or like parts as those described in FIGS. 1 and 2, and any redundant explanation concerning the above elements will be omitted.

The light-adjusting pattern 163 is formed on a surface of the transparent substrate 110, and is interposed between each of the two end portions of the source mask pattern 130 and the drain mask pattern 120. The light-adjusting pattern 163 surrounds a portion of each of the end portions of the source mask pattern 130. For example, the light-adjusting pattern 163 may have an L-shape. The width of the light-adjusting pattern 163 is no more than the resolution of an exposing device. For example, the width of the light-adjusting pattern 163 may be about 1 µm to about 2 µm. In FIG. 8, the width of the light-adjusting pattern 163 may be about 1 µm to about 1.5 µm.

For example, the light-adjusting pattern 163 may be spaced apart from the drain and source mask patterns 120 and 130 by a distance of about 1 µm to about 2 µm. In FIG. 8, the light-adjusting pattern 163 is spaced apart from the drain and source mask patterns 120 and 130 by a distance of about 1 µm to about 1.5 µm.

According to the mask of FIG. 8, the light-adjusting pattern 163 is interposed between the source and drain mask patterns 130 and 120 to surround the portion of each of the source mask pattern 130 to prevent light from being incident on a space between the source and drain mask patterns 130 and 120 from the exterior.

Figure 9:
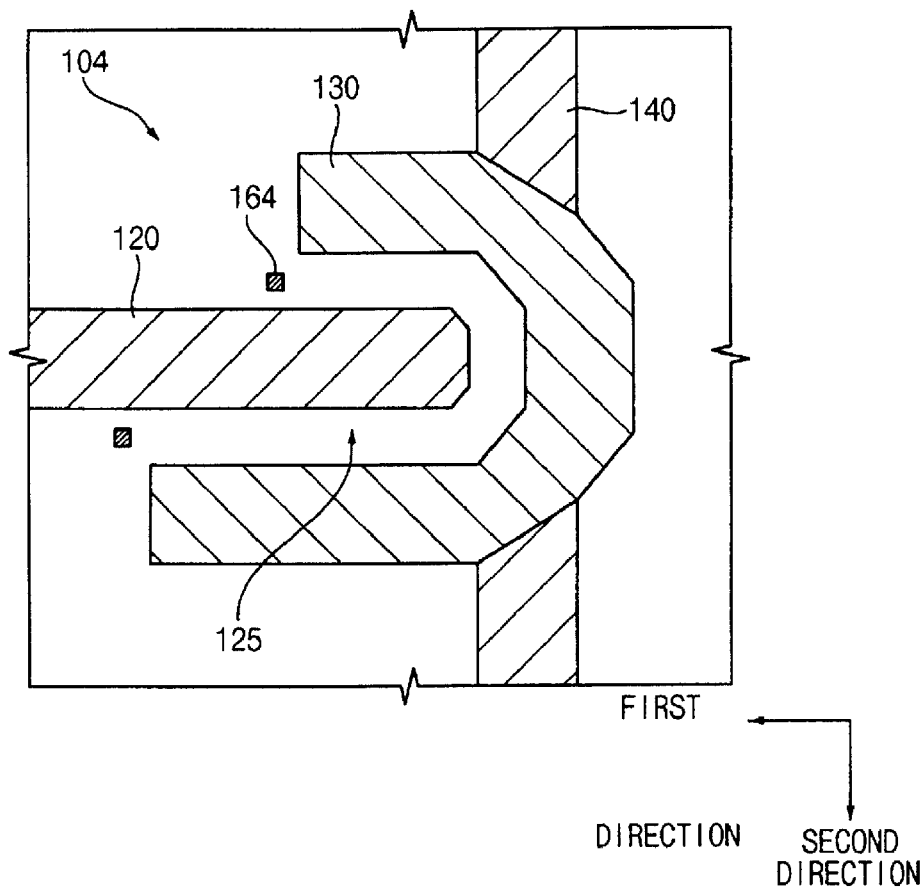
FIG. 9 is a plan view illustrating a mask for forming a TFT in accordance with a fifth example embodiment of the present invention.

FIG. 9 is a plan view illustrating a mask for forming a TFT in accordance with a fifth example embodiment of the present invention.

Referring to FIGS. 2 and 9, a mask 104 includes the transparent substrate 110, the drain mask pattern 120, the source mask pattern 130, the data mask pattern 140 and a light-adjusting pattern 164.

The transparent substrate 110 has a plate shape. The drain mask pattern 120 is formed on a surface of the transparent substrate 110. In FIGS. 2 and 9, the drain mask pattern 120 extends in a first direction.

The source mask pattern 130 is formed on the surface of the transparent substrate 110, and is spaced apart from the drain mask pattern 120. For example, the source mask pattern 130 may have a J-shape surrounding a portion of the drain mask pattern 120 when viewed on a plane.

The source mask pattern 130 spaced apart from the drain mask pattern 120 has the J-shape, so that a slit 125 having a J-shape is formed between the drain and source mask patterns 120 and 130. In FIGS. 2 and 9, the width of the slit 125 is no more than the resolution of an exposing device.

The data mask pattern 140 is formed on the surface of the transparent substrate 110, and extends from the source mask pattern 130 in a second direction that is substantially perpendicular to the first direction.

The light-adjusting pattern 164 is interposed between each of the two end portions of the source mask pattern 130 and the drain mask pattern 120 to block any light that is incident on a space between the source and drain mask patterns 130 and 120.

In FIG. 9, the light-adjusting pattern 164 is interposed between each of the end portions of the source mask pattern 130 and the drain mask pattern 120. Alternatively, the light-adjusting pattern 164 may be connected to the source mask pattern 130 or the drain mask pattern 120. A plurality of light-adjusting patterns 164 may be interposed between the source and drain mask patterns 130 and 120.

Figure 10:
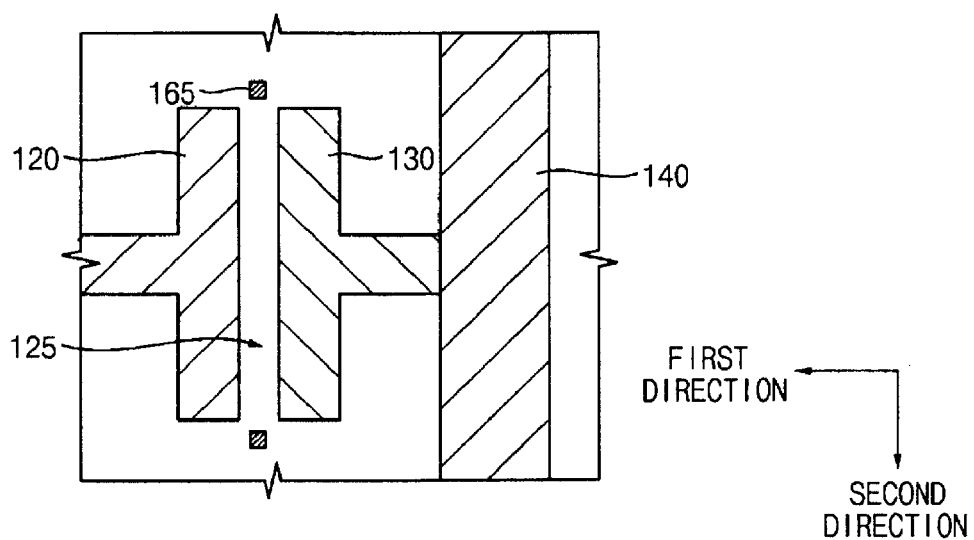
FIG. 10 is a plan view illustrating a mask for forming a TFT in accordance with a sixth example embodiment of the present invention.

FIG. 10 is a plan view illustrating a mask for forming a TFT in accordance with a sixth embodiment of the present invention.

Referring to FIGS. 2 and 10, the mask includes the transparent substrate 110, the drain mask pattern 120, the source mask pattern 130, the data mask pattern 140 and a light-adjusting pattern 165.

The transparent substrate 110 has a plate shape. The drain mask pattern 120 is formed on a surface of the transparent substrate 110. The source mask pattern 130 is formed on the surface of the transparent substrate 110, and is spaced apart from the drain mask pattern 120.

In FIGS. 2 and 10, the source mask pattern 130 extends parallel to the drain mask pattern 120. The source mask pattern 130 spaced apart from the drain-mask pattern 120 has an I-shape, so that a slit 125 having an I-shape is formed between the drain and source mask patterns 120 and 130. In FIGS. 2 and 10, the width of the slit 125 is no more than the resolution of an exposing device.

The data mask pattern 140 is formed on the surface of the transparent substrate 110 and extends in a second direction that is substantially perpendicular to the first direction. The data mask pattern 140 is connected to the source mask pattern 130.

The light-adjusting pattern 165 in interposed just outside the region between each of the two end portions of the source mask pattern 130 and each of the two end portions of the drain mask pattern 120 to block the light incident on a space between the source and drain mask patterns 130 and 120 from the exterior.

In FIG. 10, light-adjusting patterns 165 are interposed just outside the regions between each of the end portions of the source mask pattern 130 and each of the end portions of the drain mask pattern 120. Alternatively, the light-adjusting pattern 165 may be connected to the source mask pattern 130 or the drain mask pattern 120. A plurality of light-adjusting patterns 165 may be interposed between each of the end portions of the source mask pattern 130 and each of the end portions of the drain mask pattern 120.

Figure 11:
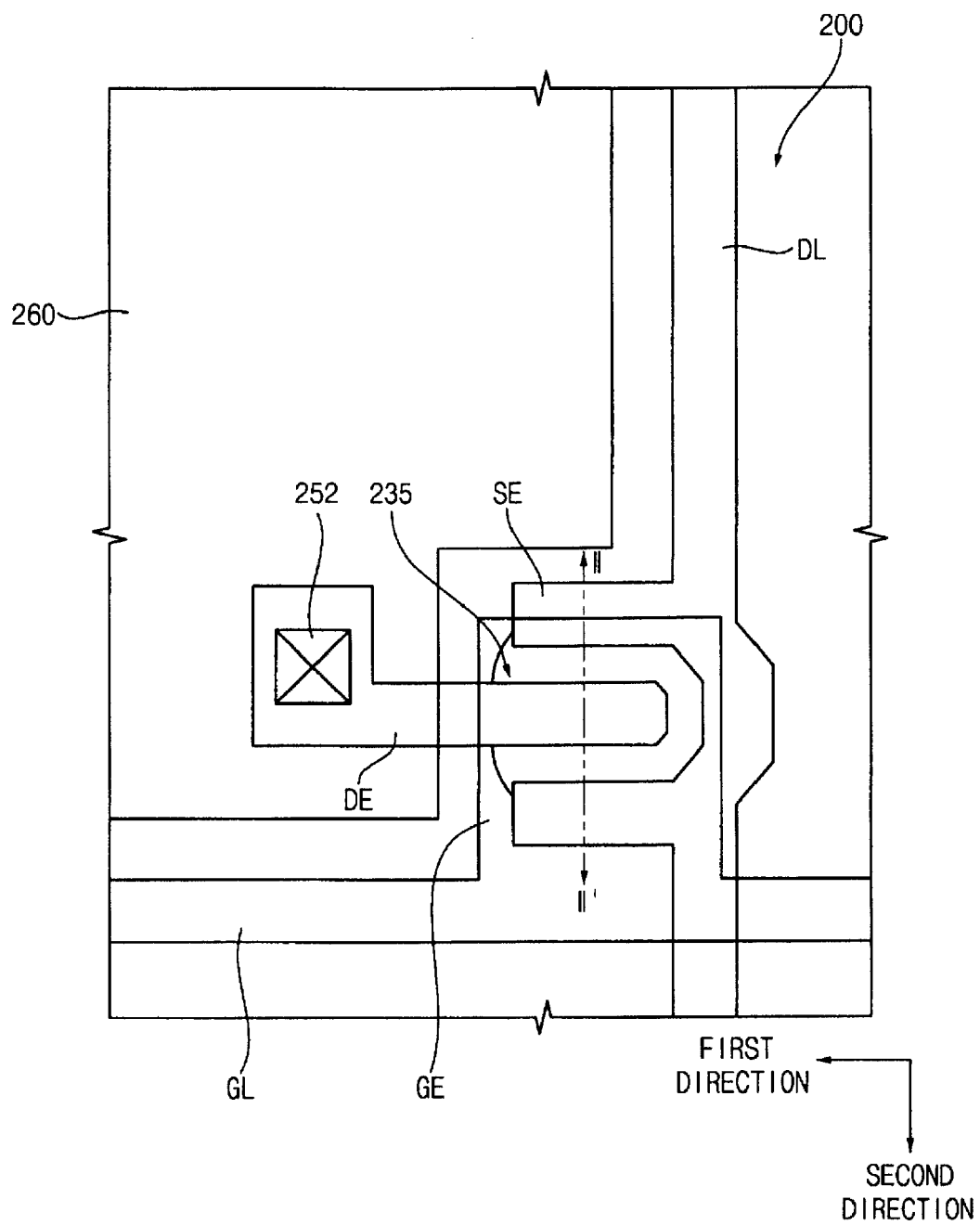
FIG. 11 is a plan view illustrating a TFT substrate in accordance with one example embodiment of the present invention.
Figure 12:
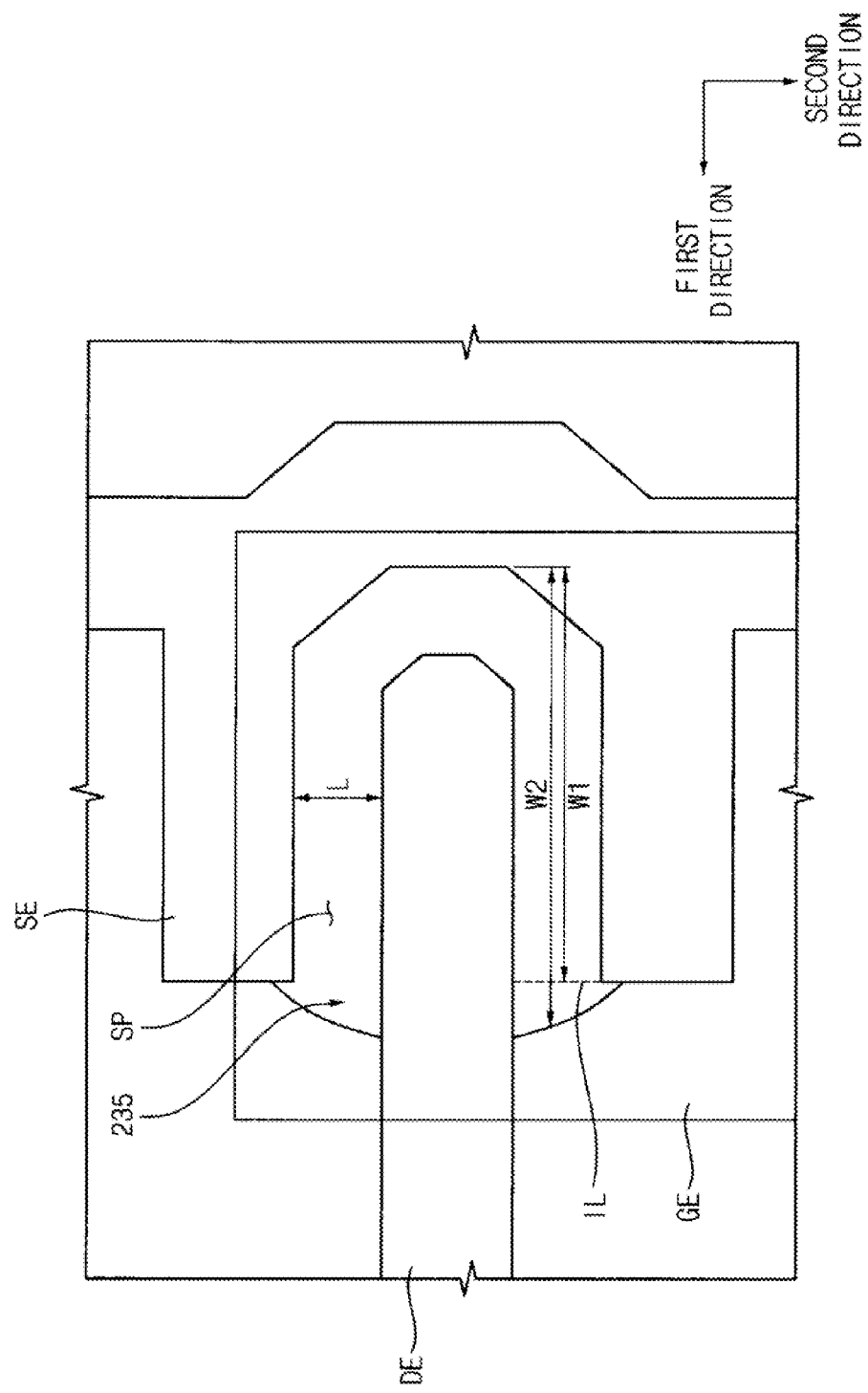
FIG. 12 is an enlarged plan view illustrating the TFT substrate shown in FIG. 11.
Figure 13:
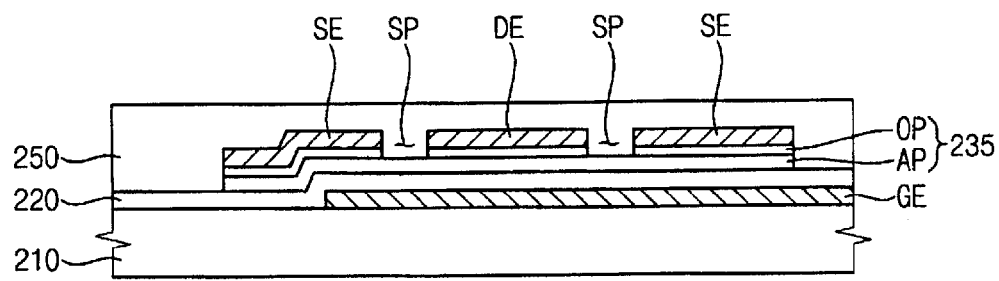
FIG. 13 is a cross-sectional view taken along a line II-II' shown in FIG. 11.

FIG. 11 is a plan view illustrating a TFT substrate in accordance with one embodiment of the present invention. FIG. 12 is an enlarged plan view illustrating the TFT substrate shown in FIG. 11. FIG. 13 is a cross-sectional view taken along a line II-II' shown in FIG. 11.

Referring to FIGS. 11 to 13, a TFT substrate 200 is formed using the mask 100 shown in FIGS. 1 to 10. The TFT substrate 200 includes a base substrate 210, a gate line GL, a gate electrode GE, a gate insulating layer 220, a semiconductor pattern 235, a data line DL, a drain electrode DE, a source electrode SE, a passivation layer 250 and a pixel electrode 260.

The base substrate 210 has a plate shape. Examples of a transparent material that can be used for the base substrate 210 include glass, quartz, a synthetic resin, etc.

The gate line GL extends in a first direction of the base substrate 210. A gate electrode GE is formed on the base substrate 210, and protrudes from the gate line GL in a second direction substantially perpendicular to the first direction.

The gate insulating layer 220 is formed on the base substrate 210 to cover the gate line GL and the gate electrode GE. Examples of an insulating material that can be used for the gate insulating layer 220 include silicon oxide (SiOx), silicon nitride (SiNx), etc. These can be used alone or in a combination.

The semiconductor pattern 235 is formed on the gate insulating layer 220 corresponding to the gate electrode GE. The semiconductor pattern 235 includes an active pattern AP and an ohmic contact pattern OP.

The active pattern AP is formed on the gate insulating layer 220 corresponding to the gate electrode GE. Examples of a semiconductor material that can be used for the active pattern AP include amorphous silicon (a-Si), poly silicon (poly-Si), etc. The ohmic contact OP is formed on the active pattern AP by implanting impurity ions at a high concentration.

The data line DL is formed on the semiconductor pattern 235, and extends in the second direction substantially perpendicularly to the gate line GL.

A drain electrode DE is formed on the semiconductor pattern 235. The drain electrode DE may extend in the first direction.

A source electrode SE is formed on the semiconductor pattern 235. For example, the source electrode SE may have a U-shape surrounding a portion of the drain electrode DE. Alternatively, the source electrode SE may have a J-shape surrounding a portion of the drain electrode DE. The source electrode SE is electrically connected to the data line DL to receive a data signal from the data line DL.

In another embodiment, the source and drain electrodes SE and DE may be formed on the semiconductor pattern 235, and may face each other to form an I-shape (as in FIG. 10).

The passivation layer 250 is formed on the gate insulating layer 220 to cover the data line DL, the drain electrode DE and the source electrode SE. Examples of an insulating material that can be used for the passivation layer 250 include an organic insulating material, an inorganic insulating material, etc. A contact hole through which the drain electrode DE is partially exposed is formed through the passivation layer 250.

The pixel electrode 260 is electrically connected to the drain electrode DE through the contact hole 252 that is formed through the passivation layer 250. The pixel electrode 260 includes a transparent conductive material. Examples of the transparent conductive material that can be used for the pixel electrode 260 include indium tin oxide (ITO), indium zinc oxide (IZO), amorphous indium tin oxide (a-ITO), etc. These can be used alone or in a combination.

Referring again to FIGS. 12 and 13, the drain electrode DE, the source electrode SE and the semiconductor pattern 235 are described as follows.

The drain electrode DE is formed on the semiconductor pattern 235, and is spaced apart from the source electrode SE. A distance L between the source electrode SE and the drain electrode DE is no more than about 3.5 μm. For example, the distance L between the source and drain electrodes SE and DE may be about 2.4 μm to about 3 μm.

The source electrode SE is spaced apart from the drain electrode DE to form a space SP between the source and drain electrodes SE and DE. In FIG. 12, the space SP between the source and drain electrodes SE and DE has a U-shape. Alternatively, the space SP between the source and drain electrodes SE and DE may have a J-shape or an I-shape.

A width W1 of the space SP between the source and drain electrodes SE and DE is a distance between a right side and a left side of the space SP in the first direction. A left end portion of the space SP between the source and drain electrodes SE and DE is aligned with the end portions of the source electrode SE in the second direction.

The semiconductor pattern 235 is interposed between the gate insulating layer 220 and the source and drain electrodes SE and DE, and overlaps the gate electrode GE. The semiconductor pattern 235 includes an active pattern AP formed on the gate insulating layer 220 and an ohmic contact pattern OP formed on the active pattern AP.

The ohmic contact pattern OP is formed under the data line DL, the drain electrode DE and the source electrode SE to have substantially the same shape as the data line DL, the drain electrode DE and the source electrode SE. The ohmic contact pattern OP is not formed in the space SP between the drain and source electrodes DE and SE.

The active pattern AP is formed under the data line DL, the drain electrode DE and the source electrode SE and in the space SP between the drain and source electrodes DE and SE to have substantially the same outline as the data line DL, the drain electrode DE and the source electrode SE.

In FIGS. 11 to 13, the active pattern AP is aligned along an imaginary line IL (see FIG. 12) that is formed between the end portions of the source electrode SE. Alternatively, the active pattern AP may extend beyond the imaginary line IL. A width W2 of the active pattern AP is no less than a width W1 of the space SP between the drain and source electrodes DE and SE.

According to the TFT substrate of FIGS. 11 to 13, the active pattern AP of the semiconductor pattern 235 extends along the imaginary line IL or extends beyond the imaginary line IL, so that the width of a channel formed in the active pattern AP may be increased. Thus, electrical characteristics of the TFT may be improved.

When a gate voltage is applied to the gate electrode GE, the channel is formed in the active pattern AP so that the source electrode SE is electrically connected to the drain electrode DE. Thus, a data signal applied to the source electrode SE is applied to the drain electrode DE through the channel. The length of the channel corresponds to the length L of the space SP between the drain and source electrodes DE and SE, and the width of the channel corresponds to the width W2 of the active pattern AP.

The electrical characteristics of the TFT are changed by the length and width of the channel. When the length of the channel is increased, a path of electrons flowing between the source and drain electrodes SE and DE gets longer so that the data signal applied to the drain electrode DE through the channel may be distorted. When the width of the channel is decreased, a width of a conduit through which the electrons flow may be decreased, again possibly causing distortion in the data signal applied to the drain electrode DE through the channel. However, in FIGS. 11 to 13, the length of the channel is decreased and the width of the channel is increased so that the chances of distortion is minimized the electrical characteristics of the TFT may be improved.

According to the TFT substrate of FIGS. 11 to 13, the distance L between the source and drain electrodes SE and DE is about 2 μm to about 3 μm. The distance L between the source and drain electrodes SE and DE is the distance between the space SP between the source and drain electrodes SE and DE. The length of the channel is decreased, and the width W2 of the active pattern AP is no less than the width W1 of the space SP between the source and drain electrodes SE and DE. Also, the width of the channel is greatly increased. Thus, the TFT substrate 200 may have the TFT having improved electrical characteristics.

FIGS. 14 to 19 are cross-sectional views illustrating a method of manufacturing the TFT substrate shown in FIG. 11. Hereinafter, the method of manufacturing the TFT substrate will be described.

Figure 14:
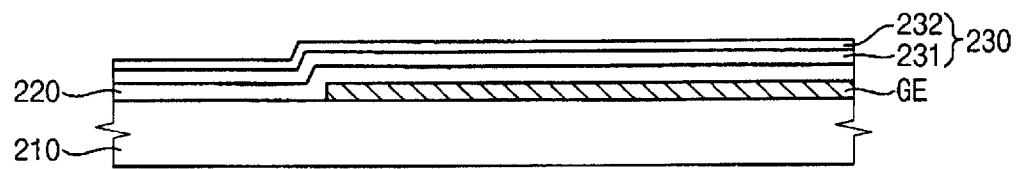
FIGS. 14 to 19 are cross-sectional views illustrating a method of manufacturing the TFT substrate shown in FIG. 11.

FIG. 14 is a cross-sectional view illustrating a process for forming a gate electrode, a gate insulating layer and a semiconductor layer on a base substrate.

Referring to FIGS. 11 and 14, the gate line GL and the gate electrode GE are formed on the base substrate 210. For example, a gate metal layer (not shown) may be formed on the base substrate 210, and the gate metal layer may be patterned to form the gate line GL and the gate electrode GE.

The gate insulating layer 220 is formed on the base substrate 210 to cover the gate line GL and the gate electrode GE.

After the gate insulating layer 220 is formed, a semiconductor layer 230 (which is later patterned to form the semiconductor pattern 235) is formed on the gate insulating layer 220. The semiconductor layer 230 includes an active layer 231 formed on the gate insulating layer 220 and an ohmic contact layer 232 formed on the active layer 231. Examples of a semiconductor material that can be used for the active layer 231 include a-Si, poly-Si, etc. The ohmic contact layer 232 is formed by implanting impurities into silicon at a high concentration.

Figure 15:
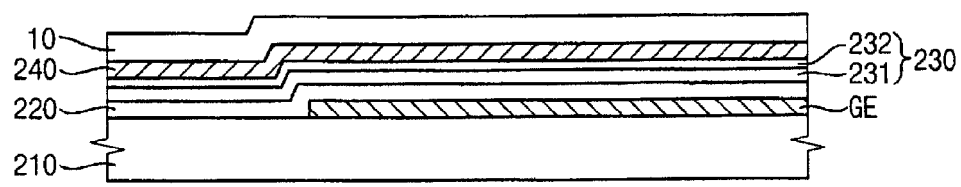

FIG. 15 is a cross-sectional view illustrating a process for forming a metal layer and a photoresist film on the substrate shown in FIG. 14.

Referring to FIG. 15, a data metal layer 240 is formed on the entire surface of the semiconductor layer 230. For example, the data metal layer 240 may be formed on the entire surface of the ohmic contact layer 232 of the semiconductor layer 230.

A photoresist film 10 is formed on the entire surface of the data metal layer 240.

Figure 16:
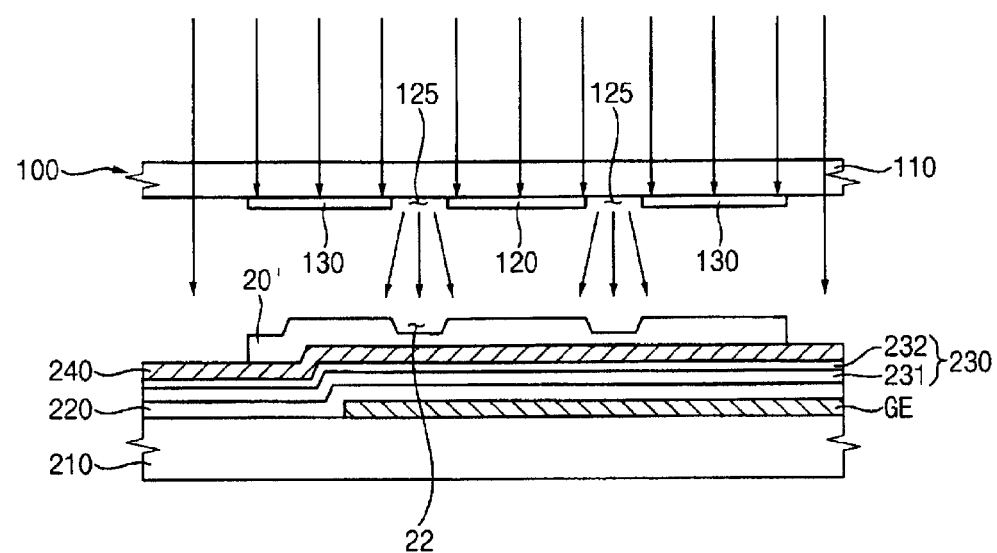

FIG. 16 is a cross-sectional view illustrating a process for exposing the photoresist film shown in FIG. 15.

Referring to FIGS. 1 to 10 and FIG. 16, the photoresist film 10 is exposed using the mask shown in FIGS. 1 to 10, and the exposed photoresist film 10 is developed to form a primitive photoresist pattern 20' having a channel groove 22.

The mask 100 includes the transparent substrate 110, the drain mask pattern 120, the source mask pattern 130 and the data mask pattern 140. The mask 100 may further include a translucent layer 150 or a light-adjusting pattern 160.

The drain mask pattern 120 is formed on a surface of the transparent substrate 110. For example, the drain mask pattern 120 may extend in a first direction. The source mask pattern 130 is formed on the surface of the transparent substrate 110, and is spaced apart from the drain mask pattern 120. For example, the source mask pattern 130 may surround a portion of the drain mask pattern 120 to have a U-shape. The data mask pattern 140 is formed on the surface of the transparent substrate 110 and extends from the source mask pattern 130 in a second direction that is substantially perpendicular to the first direction.

Alternatively, the source mask pattern 130 may have a J-shape surrounding a portion of the drain mask pattern 120. The source mask pattern 130 may face the drain mask pattern 120 to form an I-shape.

The translucent layer 150 (see FIG. 3) is formed on the surface of the transparent substrate 110 to cover the drain mask pattern 120 and the source mask pattern 130. The translucent layer 150 transmits a portion of the light incident on the mask 100 to decrease the amount of the light passing through the mask 100. The light-adjusting pattern 160 is interposed between each of the end portions of the source mask pattern 130 and the drain mask pattern 120.

A slit 125 having a U-shape, a J-shape or an I-shape may be formed between the drain mask pattern 120 and the source mask pattern 130. The width T of the slit 125 may be no more than the resolution of an exposing device. For example, when the resolution of the exposing device is about 3.5 µm, the width T of the slit 125 may be about 2 µm to about 3 µm. In FIG. 16, the width T of the slit 125 may be about 2.5 µm.

The width T of the slit 125 of the mask 100 is no more than the resolution of the exposing device, so that the light is diffracted by the slit 125 of the mask 100. Thus, the amount of light that is diffracted by the slit 125 of the mask 100 is less than the amount of direct light that is not diffracted. A fully exposed portion of the photoresist film 10, which is exposed to the direct light that passed through the mask 100, is removed. In addition, a partially exposed portion of the photoresist film 10 which is exposed to the light that is diffracted by the slit 125 of the mask 100 form the channel groove 22.

The channel groove 22 of the primitive photoresist pattern 20 has a shape corresponding to the slit 125 of the mask 100. For example, the width and depth of the channel groove 22 may be determined by the distance between the mask 100 and the photoresist film 10, the amount of the light irradiated onto the photoresist film 10, the width T of the slit 125 of the mask 100, etc. The channel groove 22 may have the U-shape, the J-shape, the I-shape, etc., when viewed on a plane. The channel groove 22 may have substantially the same shape as the slit 125 of the mask 100. The width of the channel groove 22 may be substantially the same as the width T of the slit 125 of the mask 100. Alternatively, the width of the channel groove 22 may be slightly greater than the width T of the slit 125 of the mask 100. For example, the width of the channel groove 22 may be no more than about 3.5 µm.

Referring again to FIG. 4, a portion of the light irradiated onto the portion "A" may propagate to the portion "B." When the portion of the light irradiated onto the portion "A" is incident on the portion "B," the photoresist film 10 corresponding to the portion "B" may be fully exposed to be removed. When the photoresist film 10 corresponding to the portion "B" is removed, the length of the channel groove 22 may be decreased.

In FIG. 16, the light-adjusting pattern 160 (shown in FIG. 4) is formed between each of the end portions of the source mask pattern 130 and the drain mask pattern 120 to prevent the externally provided light from propagating into a space between the source mask pattern 130 and the drain mask pattern 120. Thus, the length of the channel groove 22 may be increased.

Figure 17:
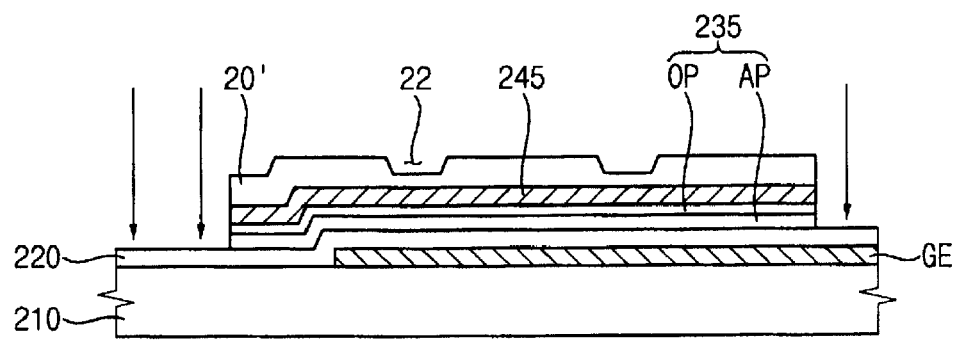

FIG. 17 is a cross-sectional view illustrating a process for partially etching the data metal layer and the semiconductor layer shown in FIG. 16.

Referring to FIG. 17, the data metal layer 240 is etched using the primitive photoresist pattern 20' as an etching mask to form the data metal pattern 245. For example, the data metal layer 240 may be etched through a wet etching process.

The semiconductor layer 230 (shown in FIG. 16) is partially etched using the primitive photoresist pattern 20' as an etching mask to form the semiconductor pattern 235. For example, the semiconductor layer 230 may be etched through a dry etching process. The semiconductor pattern 235 includes an active pattern AP and an ohmic contact pattern OP.

Figure 18:
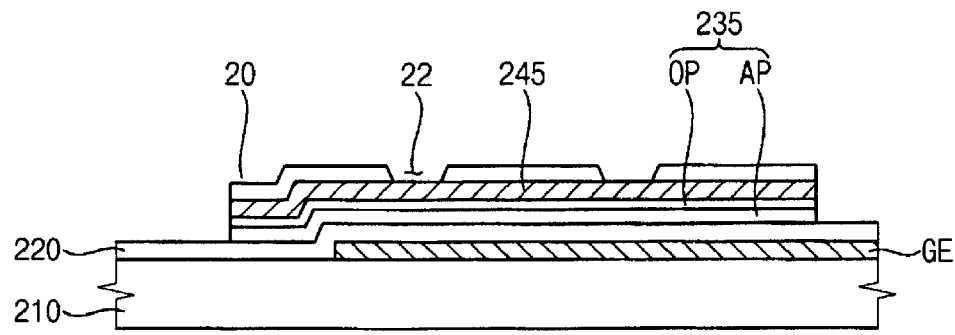

FIG. 18 is a cross-sectional view illustrating an etch-back process for the primitive photoresist pattern shown in FIG. 17.

Referring to FIG. 18, a thickness of the primitive photoresist pattern 20' is decreased by a constant thickness so that the data metal pattern 245 is partially exposed through the channel groove 22. This way, the photoresist pattern 20 is formed. The process for decreasing the thickness of the primitive photoresist pattern 20' is an etch-back process.

Figure 19:
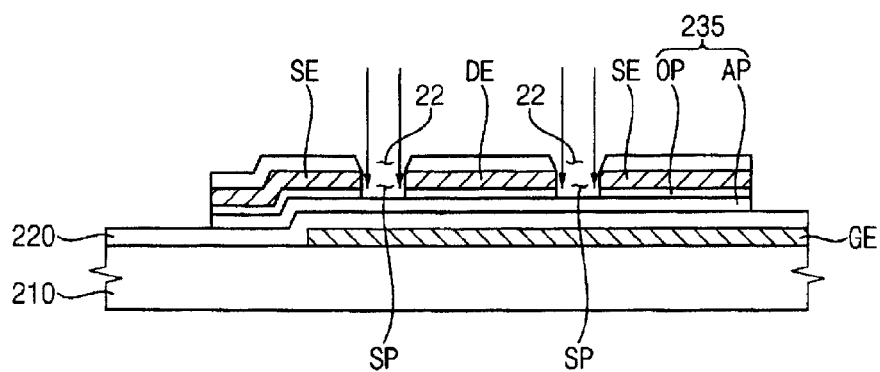

FIG. 19 is a cross-sectional view illustrating a process for partially etching the data metal pattern and the semiconductor pattern shown in FIG. 18.

Referring to FIG. 19, after the etch-back process of etching back the primitive photoresist pattern 20', the data metal pattern 245 is partially etched through the channel groove 22. Thus, the source electrode SE and the drain electrode DE are formed to define a space SP between the source and drain electrodes SE and DE. The space SP between the source and drain electrodes SE and DE may have a U-shape, a J-shape, an I-shape, etc. The space SP between the source and drain electrodes SE and DE may have substantially the same shape as the channel groove 22.

The semiconductor pattern 235 is partially etched using the photoresist pattern 20 having the channel groove 22 as an etching mask. The ohmic contact pattern OP of the semiconductor pattern 235 deposited in the space SP between the source and drain electrodes SE and DE is removed through the etching process. Thus, the active pattern AP is partially exposed through the space SP between the source and drain electrodes SE and DE.

Referring again to FIG. 12, the distance L between the source and drain electrodes SE and DE may be substantially the same as the width of the channel groove 22. Alternatively, the distance L between the source and drain electrodes SE and DE may be less than the width of the channel groove 22. For example, the distance L between the source and drain electrodes SE and DE may be no more than about 3.5 µm. A side of the active pattern AP may overlap an imaginary line IL along two sides of the source electrode SE. Alternatively, the active pattern AP may protrude from the imaginary line IL. For example, the active pattern AP may have substantially the same shape as the space SP between the source and drain electrodes SE and DE. Alternatively, the active pattern AP may protrude from the space SP between the source and drain electrodes SE and DE.

The light-adjusting pattern 160 blocks the light from propagating into the space SP between the source and drain electrodes SE and DE from the exterior, so that the length of the channel groove 22 is not decreased. Thus, the active pattern AP overlaps the imaginary line IL or extends beyond the imaginary line IL. The length of the channel groove 22 may be substantially the same as the width W2 of the active pattern AP, which corresponds to the width of the channel.

Referring again to FIGS. 11 and 13, the photoresist pattern 20 is removed from the source electrode SE, the drain electrode DE and the data line DL.

A passivation layer 250 (see FIG. 13) is formed on the gate insulating layer 220 to cover the source electrode SE, the drain electrode DE and the data line DL. The passivation layer 250 is partially removed to form a contact hole 252 (see FIG. 11) through which a portion of the drain electrode DE is exposed.

A pixel electrode 260 is formed on the passivation layer 250. The pixel electrode 260 is electrically connected to the drain electrode DE through the contact hole 252. The pixel electrode 260 includes a transparent conductive material.

According to the method of manufacturing the TFT substrate of FIGS. 14 to 19, a single U-shaped slit is formed between the source mask pattern 130 and the drain mask pattern 120, and the width T of the slit 125 is no more than the resolution of the exposing device. Thus, the distance between the source and drain electrodes SE and DE may be decreased. Therefore, the length of the channel formed in the active pattern AP may be decreased and the electrical characteristics of the TFT may be improved.

In addition, the light-adjusting pattern 160 is formed between each of the end portions of the source mask pattern 130 and the drain mask pattern 120 to block the external light that may propagate into the space between the source and drain mask patterns 130 and 120. Thus, the side of the active pattern AP may overlap the imaginary line IL that is formed along two sides of the source electrode SE, or extend beyond the imaginary line IL. Therefore, the width of the channel formed in the active pattern AP is increased and the electrical characteristics of the TFT may be improved.

According to the present invention, a mask has a single slit that has a smaller width than the resolution of an exposing device, so that a distance between source and drain electrodes may be decreased.

In addition, a light-adjusting pattern is formed between each of two end portions of a source mask pattern and a drain mask pattern to prevent externally provided light from being entering a space between the source mask pattern and the drain mask pattern. Thus, the width of the channel formed in an active pattern may not be decreased, although the active pattern and the source and drain electrodes are patterned using one mask. Therefore, the electrical characteristics of a TFT is improved.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of manufacturing a thin film transistor substrate, comprising:
    forming a gate insulating layer, an active layer, a data metal layer and a photoresist film on a base substrate having a gate electrode to cover the gate electrode;
    exposing the photoresist film using a mask to form a photoresist pattern having a channel groove, wherein the mask includes:
    a drain mask pattern,
    a source mask pattern spaced apart from the drain mask pattern and having a first side surface facing the drain mask pattern, and
    a light-adjusting pattern interposed between two end portions of the source mask pattern and the drain mask pattern to prevent light from entering a channel region between the drain and source mask patterns from a transparent region surrounding the drain mask pattern, the source mask pattern and the channel region;
    partially etching the data metal layer and the active layer using the photoresist pattern as an etching mask to form a data metal pattern and an active pattern;
    decreasing a thickness of the photoresist pattern so that the data metal pattern is exposed through the channel groove; and
    partially etching the data metal pattern through the channel groove to form a data line having a source electrode and a drain electrode.

2. The method of claim 1, further comprising forming a pixel electrode electrically connected to the drain electrode.

3. The method of claim 1, wherein the active pattern has substantially the same outline as the data line and the drain electrode except for a space between the source and drain electrodes, and
    a side of the active pattern overlaps an imaginary line or extends beyond the imaginary line that is defined by two sides of the source electrode.

4. The method of claim 1, wherein the distance between the drain and source mask patterns is about 2 μm to about 3 μm.

5. The method of claim 1, wherein the light-adjusting pattern is spaced apart from each of the drain and source mask patterns by about 1 μm to about 2 μm.

6. The method of claim 1, wherein a width of the light-adjusting pattern is about 1 μm to about 2 μm.

7. The method of claim 1, wherein the source mask pattern has a U-shape surrounding a portion of the drain mask pattern.

8. The method of claim 1, wherein the source mask pattern has a J-shape surrounding a portion of the drain mask pattern.

9. The method of claim 1, wherein the source mask pattern extends substantially parallel to the drain mask pattern.

10. The method of claim 1, wherein the light-adjusting pattern is connected to each of the end portions of the source mask pattern.

11. The method of claim 1, wherein the light-adjusting pattern is connected to the drain mask pattern.

12. The method of claim 1, wherein the light-adjusting pattern is interposed between each of the end portions of the source mask pattern and the drain mask pattern.

13. The method of claim 1, wherein the light-adjusting pattern surrounds a portion of each of the end portions of the source mask pattern.

14. The method of claim 1, wherein the light-adjusting pattern is disposed adjacent to a distal end of the first side surface.

15. The method of claim 13, wherein the light-adjusting pattern has an L-shape.

* * * * *